United States Patent [19]

Tokuda

[11] Patent Number: 4,459,574
[45] Date of Patent: Jul. 10, 1984

[54] DRIVING CIRCUIT FOR A COIL

[75] Inventor: Ryuji Tokuda, Tokyo, Japan

[73] Assignee: Canon Kabushiki Kaisha, Tokyo, Japan

[21] Appl. No.: 379,909

[22] Filed: May 19, 1982

[30] Foreign Application Priority Data

May 29, 1981 [JP] Japan .................................. 56-82670

[51] Int. Cl.³ .......................... H01F 1/00; H01F 7/00; H01F 61/00; G03B 7/08
[52] U.S. Cl. .................................... 335/217; 354/464; 354/235.1
[58] Field of Search ...................... 354/60 R, 234, 235, 354/464, 235.1; 335/217

[56] References Cited

U.S. PATENT DOCUMENTS 3,953,865 4/1976 Matsumoto ........................ 354/60 R
4,099,115 7/1978 Watanabe ........................... 354/60 R Primary Examiner—Russell E. Adams
Attorney, Agent, or Firm—Toren, McGeady and Stanger

[57] ABSTRACT

In the disclosed driving circuit for a coil, particularly for driving a coil in a device such as a camera whose shutter blades are driven with electro-magnetic force generated by a current flowing through the coil and a magnetic field in which the coil is positioned, a voltage approximately proportional to the absolute temperature is applied across the terminals of the coil so as to produce temperature compensation of the coil current.

5 Claims, 3 Drawing Figures

DRIVING CIRCUIT FOR A COIL

BACKGROUND OF THE INVENTION

1. Field of the Invention

The present invention relates to a driving circuit for a coil, particularly for driving a coil in an instrument such as a camera whose shutter blades are driven with the electro-magnetic force generated by interaction between a current flowing through the coil and a magnetic field in which the coil is positioned.

2. Description of the Prior Art

In cameras which achieve an electro-magnetic driving force by virtue of current flowing through a coil placed in a magnetic field and drive shutter blades with the electro-magnetic driving force (hereinafter referred to as cameras employing an electro-magnetic shutter driving force), the shutter blades are directly driven by the electro-magnetic force. Therefore, unless a constant electro-magnetic driving force can be obtained, a correct control of shutter driving cannot be obtained and a correct exposure control cannot be expected.

That is, since the running speed of the shutter blades themselves change depending on the electro-magnetic driving force in an above-mentioned type of camera, it becomes necessary always to obtain a constant electro-magnetic driving force.

Because of this necessity, it is particularly desirable that the coil current flowing through the coil be regulated to a stable constant value over temperature and that the voltage variation of a power source in such type of camera also be constant.

To meet this requirement, it would be possible to use a known type of constant current driving circuit (shown in FIG. 1) as a coil driver in such a camera. Here, a reference voltage $V_{ref}$ which is derived, for example, from a well known band-gap reference voltage circuit and is stable with temperature is applied to a non-inverting input terminal of an operational amplifier 101. A voltage across a resistor 103 (whose value is supposed to be stable over temperature and is represented by R) which represents a current flowing through a coil 104 is applied to an inverting input terminal of said operational amplifier 101, form a negative feedback circuit. The voltage across the resistor 103 always is made equal to $V_{ref}$ and current represented by a formula, $(V_{ref}/R)$, is always made to flow through the coil 104, so that the coil current will not be affected by a variation in a power source voltage and a temperature variation.

However, when such method is applied to a coil driving circuit in a camera using an electro-magnetic driving force for shutter, the following shortcomings will occur.

Since a relatively great power is needed as an electro-magnetic force in the above-mentioned type of camera, the product of the current flowing through the coil and the number of turns of the coil needs to be made larger, and as a result, a value of (coil resistance) × (coil current) = (voltage across the coil)

cannot be made small.

Also, there will be a certain restriction in the number of turns of coil from various aspects such as a weight and size of the coil, and as a result the coil current itself needs to have a greater value (several hundreds of mA) than that of an ordinary solenoid for a shutter. Thus, a relatively low voltage such from a battery has inevitably to be used for $V_{BAT}$ in FIG. 1 without boosting since a power source needs to be made small in application to a small size apparatus such as a camera, even if a relatively high power source voltage from a booster circuit such as DC/DC converter, can be used for a control circuit with small power consumption. With this restriction, it is not desirable from a practical point of view that a minimum operation voltage be raised by the voltage across the resistor 103.

Such apparent rising of the minimum operation voltage may be accepted to some extent when the values of the reference voltage $V_{ref}$ and the resistor 103 are reduced. However, when a coil current is adjusted, the reduced $V_{ref}$ or the resistor value R requires a further fine adjustment. This involves some difficulty is involved.

On the other hand, according to another well known driving circuit, it is possible that a reference voltage $V_{ref}$ such as shown in FIG. 1 is applied to a non-inverting input terminal of an operational amplifier 201, as shown in FIG. 2, and a voltage obtained by dividing a voltage across a coil 205 with resistors 203 and 204 (the values of which are represented by $R_1$, $R_2$, respectively) is fed back to an inverting-input of the amplifier 201.

In FIG. 2, since a negative feedback loop is formed such that the manner that a voltage across the resistor 203 becomes equal to the $V_{ref}$, the voltage across the coil 205 is always controlled to a value represented by $$V_{ref} \times (R_1 + R_2/R_1),$$

and, thus, the current flowing through the coil will be constant at a constant temperature with power source variation. Hence, it becomes possible to compensate for the temperature coefficient of a coil resistance with temperature by providing an appropriate temperature coefficient for each of the resistors 203, 204, thus restraining a change in the coil current over temperature.

However, supposed that the temperature coefficient of the coil resistance is equivalent to that of a copper wire, namely about +3,900 ppm/°C., while temperature coefficients of an ordinary carbon film resistor, and a metal film resistor are ± a few or several hundreds of ppm/°C. Therefore, a special material for resistor will be needed to effect temperature compensation of a coil current with the schematic shown in FIG. 2. Thus the compensation will be difficult to apply for an industrial mass production, because an instability in performance, a nonlinearity and a disadvantage in a cost constitute unavoidable obstacle as far as a current level of related industries is concerned.

Further, when the resistor 203 or the resistor 204 needs to be a variable resistor for adjustment of a coil current in the above method, the difficulty becomes greater.

SUMMARY OF THE INVENTION

It is accordingly, an object of the present invention to provide an improved driving circuit for a coil which overcomes the disadvantages of prior art devices.

It is another object of the present invention to provide a coil driving circuit which supplies a substantially constant current over temperature and power source variation for a coil in a camera having an electro-magnetic driving force for shutter.

It is a further object of the present invention to provide a coil driving circuit applying a voltage approximately proportional to the absolute temperature across the coil thereby effecting a temperature compensation for a coil current.

These and further objects and features of the invention will become apparent from the following detailed description of an embodiment thereof taken in connection with the accompanying drawings.

DESCRIPTION OF THE PREFERRED EMBODIMENTS

The following describes a driving circuit for a coil in a camera using an electro-magnetic driving force for shutter according to the present invention.

Figure 3:
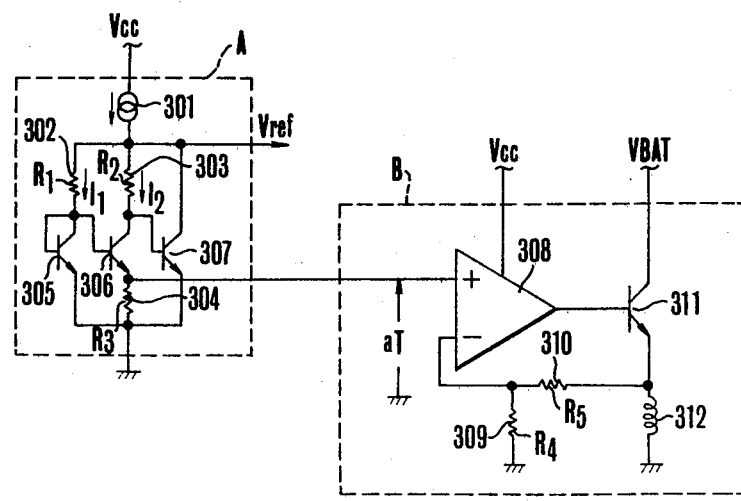
FIG. 3 is a circuit diagram to show an example of a driving circuit for a coil according to the present invention.

FIG. 3 is a circuit diagram to showing an example of a coil driving circuit according to the present invention. In the drawing, a Block A surrounded by a dotted line is a socalled band-gap regulator circuit, and a Block B is a driving circuit for a coil. In the Block A, element 301 is a current source, elements 302, 303 and 304 are resistors having resistance values $R_1$, $R_2$, $R_3$, respectively, and elements 305, 306, 307 are NPN transistors having fairly similar properties. These circuit elements constitute a well known band-gap regulator circuit which produces a votage value corresponding to a band-gap energy of silicon and at the same time produces a reference voltage $V_{ref}$ having almost no variation over temperature. (The stable reference voltage $V_{ref}$ is very usable for circuit operation.)

In The Block B, element 308 is an operational amplifier, and elements 309, 310 are resistors having resistance values $R_4$, $R_5$, respectively and constituting a feedback loop, while member 311 is a large current controlling transistor, and element 312 is a coil.

Figure 1:
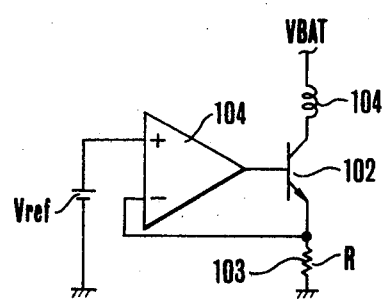
FIG. 1 is a circuit diagram to show an example of a conventional constant current driving circuit.
Figure 2:
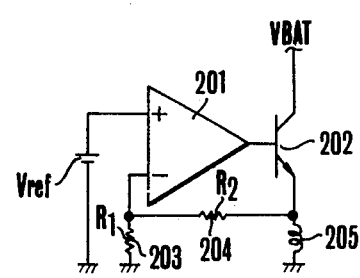
FIG. 2 is a circuit diagram to show another example of a conventional constant current driving circuit.

Block B has almost the same structure as that of the conventional driving circuit shown in FIG. 2. What is different from the circuit shown in FIG. 2 is that instead of applying the output $V_{ref}$ of the band-gap regulator circuit to a non-inverting input terminal of the operational amplifier 308, a voltage aT across the resistor 304 in the Block A (band-gap regulator circuit) is applied thereto.

The band-gap regulator circuit in the Block A and the operational amplifier 308 in the Block B are supplied with a voltage $V_{cc}$ having relatively small capacity but high voltage which is, for example, boosted from the battery voltage $V_{BAT}$ connected to a collector of the coil driving transistor 311. The voltage $V_{BAT}$ is, as described before, an output of batteries and has lower voltage but larger capacity than $V_{cc}$.

Since the driving circuit for a coil shown in FIG. 3 has the above-mentioned arrangement, a negative feedback loop is formed such that a voltage across the resistor 309 is always equal to the non-inverting input voltage aT of the amplifier 308 as in FIG. 2, and the voltage across the coil 312 is so controlled so as always to become $aT \times (R_4 + R_5/R_4)$.

The properties of the voltage aT are as follows.

In the Block A, since a collector of the transistor 305 is connected to a base thereof, it has the same value as the base-emitter potential $V_{BE}$ of the transistor 305. On the other hand, the collector of the transistor 306 similarly has the same value as $V_{BE}$ as it is connected to the base of the transistor 307. Therefore, the collector potentials of the transistors 305 and 306 may be almost equal to each other. Also one end of each of the resistors 302 and 303 is connected to the common potential $V_{ref}$, therefore a ratio of a current $I_1$ flowing to the transistor 305 through the resistor 302 to a current $I_2$ flowing to the transistor 306 through the resistor 303 will become $R_2:R_1$. Therefore, the potential aT across the resistor 304 will be expressed by the following formula:

$$aT = (V_{BE} \text{ of transistor 305}) - (V_{BE} \text{ of transistor 306})$$

$$= \frac{kT}{q} \ln \frac{I_1}{i_o} - \frac{kT}{q} \ln \frac{I_2}{i_o}$$

$$= \frac{kT}{q} \ln \frac{I_1}{I_2}$$

$$= \frac{kT}{q} \ln \frac{R_2}{R_1},$$

wherein, q : a charge of one electron;
T : absolute temperature;
$i_o$: backward saturation current at base-emitter junction;
k : Boltmann's constant.

That is, since it can be expected with great probability that the value of $(R_2/R_1)$ is constant regardless of temperature, the voltage aT will be proportional to the absolute temperature.

Also, the band-gap reference voltage, $V_{ref}$ is expressed by the formula, $$V_{ref} = (V_{BE} \text{ of transistor 307}) + \left( \frac{R_2}{R_3} \cdot \frac{kT}{q} \ln \frac{R_2}{R_1} \right).$$

The $V_{BE}$ of the transistor shown in the first term of the above formula generally has a negative temperature coefficient ordinarily defined as $-2$ m V/°C. at approximately 600m V to 700 m V. Therefore, if the resistor values of $R_1$, $R_2$, and $R_3$ are selected so that the absolute value at a normal temperature (25° C.) of the second term becomes almost same as that of the first term, namely 600 m V to 700 m V, a positive temperature coefficient of $+2$ m V/°C. can be obtained from a temperature coefficient $+3356$ ppm/°C. as shown in the following formula:

$+3356$ ppm/°C.$\times 600$ m V$\div 2$ m V/°C.

This $+3356$ ppm/°C. is drived from being proportional to the absolute temperature, as described later.

As mentioned above, the negative temperature coefficient in the first term and the positive temperature coefficient in the second term are cancelled out, and a reference voltage of about 1.2 to 1.3 V independent of temperature is obtained.

The relationship between a voltage proportional to the absolute temperature and a temperature coefficient is as follows.

A temperature coefficient is generally defined as follows:

(Temperature coefficient) =

$$\frac{(\text{value at normal temperature } t = 25° \text{ C.}) - (\text{value at } t = t_1°\text{C.})}{\frac{\text{value at normal temperature } t = 25° \text{ C.}}{(25° \text{ C.} - t_1)}}$$

From this definition, a temperature coefficient of a voltage proportional to the absolute temperature is shown as follows, where "a" is a proportional constant and "T" is equal to (273+t°C.).

$$\begin{array}{l}\text{(Temperature coefficient} \\ \text{of being proportional to} \\ \text{absolute temperature)}\end{array} = \frac{\frac{a \times (25 + 273) - a \times (t_1 + 273)}{a \times (25 + 273)}}{25 - t_1}$$

$$= \frac{1}{298} = 3356 \text{ ppm/°C.}$$

Therefore, the voltage aT proportional to the absolute temperature will have a temperature coefficient of +3356 ppm/°C. Since a voltage impressed across the coil 312 is $aT \times (R_4+R_5/R_4)$ as mentioned above, if same kinds of resistors are used for the resistors 309 and 310, a voltage having the temperature coefficient of 3356 ppm/°C. is always impressed across the coil 312.

On the other hand, since the coil 312 has a temperature coefficient of copper wire of about +3900 ppm, the temperature variation of the coil current is expressed by the following equation:

$$\text{(coil current)} = \frac{V\{1 + (t - 25) \times 3356 \times 10^{-6}\}}{r\{1 + (t - 25) \times 3900 \times 10^{-6}\}} \approx$$

$$\frac{V}{r} \{1 - (t - 25) \times 544 \times 10^{-6}\}.$$

In the above equation, V represents a voltage across the coil at a normal temperature, and r represents a resistance value of the coil at normal temperature.

As is apparent from the above equation, the temperature coefficient of the coil current is about −544 ppm. This means that a current value will change only $-544 \times 10^{-6} \times 50 = -2.72\%$ with a temperature change of about 50° C. from a normal temperature. Thus it is regarded as practically a constant current. Further, this value can be made almost zero by utilizing a difference of temperature coefficients of quite ordinary resistors, for example, using a carbon film resistance for the resistor 309 and a metal film resistor for the resistor 310 in FIG. 3.

By such arrangement, a coil current can be controlled to a stable and constant value over a variation in a voltage and a temperature. By using this circuit for a coil driving circuit in a camera having an electro-magnetic driving force for shutter, a constant electro-magnetic driving force can always be obtained, and a correct control of shutter running can always be carried out by driving the shutter blades with the driving force.

A part of so-called band-gap regulator circuit itself is used for producing a reference voltage proportional to the absolute temperature in the above-mentioned example. This utilizes the theorem that a difference of base-emitter voltages between a pair of transistors, which is obtained by positively producing a constant ratio of current density at a junction plane of the pair of transistors, is exactly proportional to the absolute temperature. Hence, concrete arrangement therefor is not restricted to what is shown in FIG. 3. Also the voltage proportional to the absolute temperature may be used through a buffer or an amplifier for other kinds of applications than those mentioned above. Further, the above-mentioned arrangement of the driving circuit is basically to show an example that a potential across a coil is controlled to a constant voltage having temperature characteristics compensating a temperature coefficient of coil. Other types of constant voltage control circuits using feedback may also be employed.

As has been explained above, it is possible to obtain a coil current which is stable not only with a variation in a power source voltage but with a variation in temperature, even at lower voltages of the power source compared to prior driving circuits. When the present invention is applied to a shutter device utilizing an electro-magnetic driving force obtained by supplying current to a coil placed in a magnetic field a stable shutter operation can be guaranteed. This is a great advantage. Also, concerning repeatability of the properties, the invention is quite suitable particularly for a device made employing integrated circuit techniques compared to a case when elements with greater temperature coefficient are used as in FIG. 2. Also, when a reference voltage which is stable with temperature is needed within a same integrated circuit, a portion thereof can be used in common to form a driving circuit for a coil according to the present invention, and it will not result in an increase in a chip size of integrated circuit, thus affording great advantages from the viewpoint of cost.

What is claimed is:

1. A driving circuit for a coil which comprises a reference voltage circuit to produce a voltage approximately proportional to the absolute temperature, a detection circuit to detect a voltage corresponding to a potential between terminals of the coil, an operational amplifier coupled to an output of said reference voltage circuit and to which an output of said detection circuit is negatively fed back, and a control element to supply a coil current based on the output of said amplifier.

2. A driving circuit for a coil according to claim 1, in which the coil is a coil for controlling a shutter and is placed in a magnetic field to drive a shutter member with an electro-magnetic driving force generated by supplying power to the coil.

3. A driving circuit for a coil according to claim 1, in which the voltage is proportional to the absolute temperature derived from a difference of base-emitter voltages between a pair of transistors which is obtained by a constant ratio of current densities at base-emitter junctions of said pair of transistors.

4. A coil current driving circuit to apply a voltage across the coil to substantially compensate a temperature coefficient of the coil, comprising a reference voltage circuit for producing a voltage having a temperature coefficient substantially equal to the temperature coefficient of the coil, a detection circuit for detecting a voltage corresponding to a potential between the terminals of the coil, an operational amplifier for receiving an output of the reference voltage circuit as a reference voltage and at the same time for receiving an output of said detection circuit as a negative feedback, and a control element to supply coil current based on an output of said amplifier.

5. A driving circuit as in claim 1, wherein said reference voltage circuit includes a pair of transistors each having base-emitter junctions, means for producing a constant ratio of current densities at the base-emitter junctions and deriving a difference of base-emitter voltages between the pair of transistors to obtain the voltage proportional to the absolute temperature.

* * * * *